US008785878B2

(12) United States Patent
Arita et al.

(10) Patent No.: US 8,785,878 B2
(45) Date of Patent: Jul. 22, 2014

(54) CHARGED PARTICLE BEAM APPARATUS

(71) Applicant: Canon Kabushiki Kaisha, Tokyo (JP)

(72) Inventors: Keiichi Arita, Himeji (JP); Masahito Shinohara, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/680,759

(22) Filed: Nov. 19, 2012

(65) Prior Publication Data

US 2013/0143161 A1 Jun. 6, 2013

(30) Foreign Application Priority Data

Dec. 1, 2011 (JP) ................................. 2011-264124

(51) Int. Cl.
*G21K 5/04* (2006.01)
*H01J 37/30* (2006.01)
*H01J 37/317* (2006.01)
*H01J 3/26* (2006.01)
*H01J 29/70* (2006.01)

(52) U.S. Cl.
CPC .. *H01J 37/30* (2013.01); *H01J 3/26* (2013.01); *H01J 29/70* (2013.01); *H01J 37/3174* (2013.01); *H01J 2237/3175* (2013.01)
USPC ..................... 250/396 R; 250/397; 250/492.1; 250/492.3; 250/305

(58) Field of Classification Search
CPC ... H01J 37/30; H01J 37/3002; H01J 37/3174; H01J 37/3175; H01J 2237/31715; H01J 2237/31716; H01J 2237/3175; H01J 3/26; H01J 29/70

USPC ...... 250/396 R, 397, 398, 396 ML, 305, 306, 250/307, 309, 310, 311, 492.1, 492.3
See application file for complete search history.

(56) References Cited

U.S. PATENT DOCUMENTS

2005/0127307 A1* 6/2005 Yahiro ........................ 250/492.1

FOREIGN PATENT DOCUMENTS

JP 8-037141 A 2/1996
JP 2006-194618 A 7/2006

* cited by examiner

*Primary Examiner* — Nicole Ippolito
(74) *Attorney, Agent, or Firm* — Rossi, Kimms & McDowell LLP

(57) ABSTRACT

An apparatus includes an irradiation device configured to irradiate an object with charged particle beams, a measurement device configured to measure a characteristic of each of charged particle beams, and a controller. The measurement device includes a plate including knife edges, and a sensor configured to detect a charged particle beam incident thereon via the plate. The controller causes one charged particle beam, selected from the charged particle beams, to perform a scan relative to the measurement device so that the one charged particle beam traverses at least two knife edges among the plurality of knife edges, and to generate correction information for correcting a measurement error of the measurement device due to deformation of the plate, based on an output from the sensor upon the scan.

6 Claims, 8 Drawing Sheets

CHARGED PARTICLE BEAM APPARATUS

BACKGROUND OF THE INVENTION

1. Field of the Invention

The present invention relates to a charged particle beam apparatus.

2. Description of the Related Art

In a drawing method which uses a plurality of electron beams, it is necessary to periodically measure and correct the characteristics of the electron beams in order to reduce the influence of variations and temporal changes in characteristics of the electron beams. If each electron beam has a size sufficiently larger than that of each pixel of a commonly available image sensor, the characteristics of the electron beam can be directly measured using the image sensor. However, in practice, the size of each electron beam is as small as several tens of nanometers, so the characteristics of the electron beam cannot be directly measured.

To measure the characteristics of electron beams, a measurement scheme which uses, for example, knife edges is effective. However, when a plate including knife edges is directly irradiated with electron beams, the positions of the knife edges change with a change in temperature of the plate. The change in position of the knife edges due to heat leads to a measurement error of the irradiated positions of the electron beams. To correct this error, there may be a method of measuring the positions of the knife edges with electron beams. Nevertheless, it may also pose the problem that the irradiated positions of electron beams for measurement change, thus generating a measurement error of the positions of the knife edges. Since the position accuracy of the knife edges and the irradiated position accuracy of the electron beams influence each other, the positions of the knife edges and the irradiated positions of the electron beams must be measured independently of each other.

As a method of monitoring a change in characteristics of the knife edges, a method of comparing measurement values with normal measurement values has been proposed in Japanese Patent Laid-Open No. 2006-194618. Japanese Patent Laid-Open No. 8-37141 proposes a method of monitoring the intensity of a beam eclipsed by a plurality of apertures in an optical system to specify the position to which the beam has drifted. However, neither Japanese Patent Laid-Open No. 2006-194618 nor 8-37141 describes how to accurately measure a fluctuation in position of the knife edges using electron beams having irradiated positions which may fluctuate.

SUMMARY OF THE INVENTION

The present invention provides, for example, a technique advantageous in terms of reducing a measurement error due to a change in position of a knife edge.

One of the aspects of the present invention provides a charged particle beam apparatus including an irradiation device configured to irradiate an object with a plurality of charged particle beams, the apparatus comprising: a measurement device configured to measure a characteristic of each of a plurality of charged particle beams; and a controller, wherein the measurement device includes a plate including a plurality of knife edges, and a sensor configured to detect a charged particle beam incident thereon via the plate, wherein the controller is configured to cause one charged particle beam, selected from the plurality of charged particle beams, to perform a scan relative to the measurement device so that the one charged particle beam traverses at least two knife edges among the plurality of knife edges, and to generate correction information for correcting a measurement error of the measurement device due to deformation of the plate, based on an output from the sensor upon the scan.

Further features of the present invention will become apparent from the following description of exemplary embodiments with reference to the attached drawings.

DESCRIPTION OF THE EMBODIMENTS

An embodiment of the present invention will be described below with reference to the accompanying drawings. Although an example in which the present invention is applied to an electron beam drawing apparatus which draws a pattern on a substrate with an electron beam will be given hereinafter, the present invention is applicable to all charged particle beam apparatuses having a function of irradiating an object with a charged particle beam. The concept of the charged particle beam includes not only an electron beam but also an ion beam. Also, the concept of the charged particle beam apparatus includes, for example, a microscope such as an electron microscope, and an analysis device which analyzes a surface structure.

Figure 1:
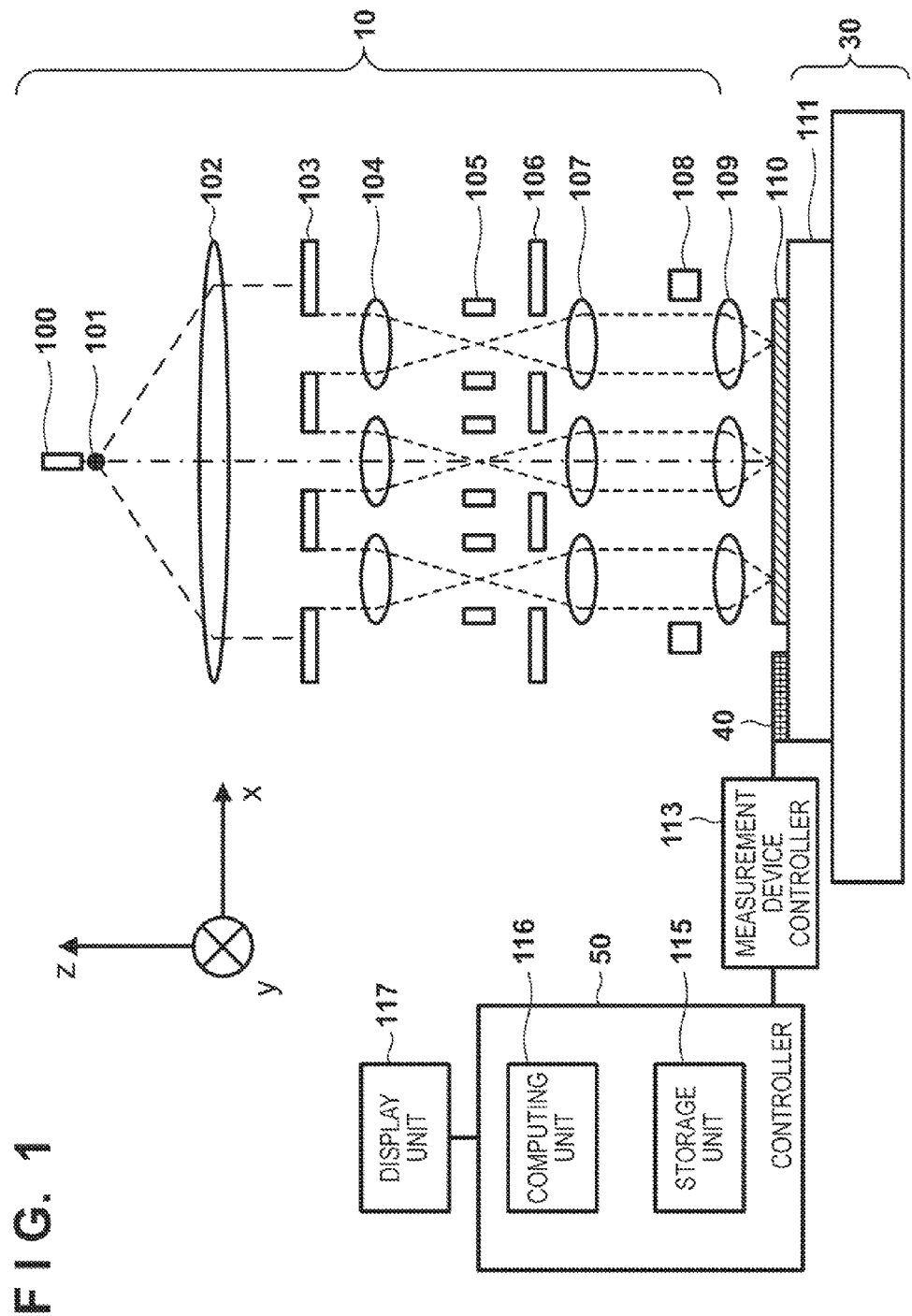
FIG. 1 is a view showing the schematic configuration of an electron beam drawing apparatus as one embodiment of a charged particle beam apparatus according to the present invention.

An electron beam drawing apparatus EB as one embodiment of a charged particle beam apparatus according to the present invention will be described with reference to FIG. 1. The electron beam drawing apparatus EB can include an irradiation unit 10 which irradiates a substrate (object) 110 with a plurality of electron beams (charged particle beams), a substrate driving mechanism 30 which moves the substrate 110, and a measurement device 40 which measures the characteristics of the plurality of electron beams (charged particle beams). The electron beam drawing apparatus EB can also include a controller 50 and display unit 117.

The irradiation unit 10 can include an electron gun 100, condenser lens 102, aperture arrays 103 and 106, lens array 104, blanker array 105, electromagnetic lenses 107 and 109, and deflector 108. A crossover image 101 is formed by the electron gun 100. The condenser lens 102 generates a collimated electron beam using electrons from the crossover image 101. The aperture array 103 includes a plurality of two-dimensionally arrayed apertures, which extract a plurality of electron beams from the electron beam generated by the condenser lens 102. The lens array 104 includes a plurality of two-dimensionally arrayed electrostatic lenses, and forms intermediate images of the crossover image 101 using the plurality of electron beams, respectively, from the aperture array 103. Note that the intermediate images of the crossover image 101 can be formed on the plane on which the blanker array 105 is arranged.

The blanker array 105 is formed by two-dimensionally arraying a plurality of electrostatic blankers capable of individually deflecting a plurality of electron beams, and individually controls ON/OFF of the irradiation of the substrate with the plurality of electron beams. Electron beams which are not deflected by the electrostatic blankers are not blocked by the aperture array 106 and impinge on the substrate 110. Electron beams deflected by the electrostatic blankers are blocked by the aperture array 106 and do not impinge on the substrate 110.

The electron beams having passed through the aperture array 106 are projected onto the substrate 110 by the electromagnetic lenses 107 and 109. The substrate 110 is held by a substrate stage 111. The substrate driving mechanism 30 moves the substrate stage 111 to move the substrate 110. The deflector 108 collectively deflects the electron beams to be guided onto the substrate 110. A pattern is drawn on the substrate 110 by controlling ON/OFF of the irradiation of the substrate 110 with the plurality of electron beams by the blanker array 105 while scanning the electron beams in the main scanning direction by the deflector 108, and scanning the substrate 110 in the sub-scanning direction by the substrate driving mechanism 30.

Since the relationship between the deflection command value for the deflector 108 and the amount of deflection of the electron beams by the deflector 108 is calibrated in advance, the deflector 108 can deflect the electron beams by a desired amount. Changing the amount of deflection of the electron beams by the deflector 108 amounts to changing the incident positions of the electron beams on the substrate 110 or measurement device 40. Typically, the substrate stage 111 may vibrate due to, for example, disturbance. By measuring a displacement of the substrate stage 111 using, for example, an interferometer (not shown), and feeding it back to the deflection command value, a fluctuation in irradiated position of the electron beams on the substrate 110 due to the vibration of the substrate stage 111 can be reduced.

The measurement device 40 is set on the substrate stage 111. The measurement device 40 can be used to measure, for example, the intensity (current), shape (intensity distribution), and irradiated position of each electron beam. The measurement device 40 can be controlled by a measurement device controller 113. The measurement device controller 113 drives the measurement device 40 based on a command from the controller 50, and transmits a signal output from the measurement device 40 or a signal obtained by processing the output signal to the controller 50. The controller 50 stores the signal transmitted from the measurement device 40 via the measurement device controller 113 in a storage unit 115, and makes a computing unit 116 process the stored signal, thereby obtaining the characteristics of each electron beam, such as the intensity (current), shape (intensity), and irradiated position of this electron beam. The thus obtained characteristics of each electron beam can be displayed on, for example, the display unit 117 for an adjustment operation by the operator. The controller 50 may be configured to adjust, for example, signals for controlling the lens array 104 and electromagnetic lenses 107 and 109, and the phase of a signal supplied to the blanker array 105, based on the obtained characteristics of each electron beam, so that characteristics of this electron beam reach target characteristics.

Figure 2A:
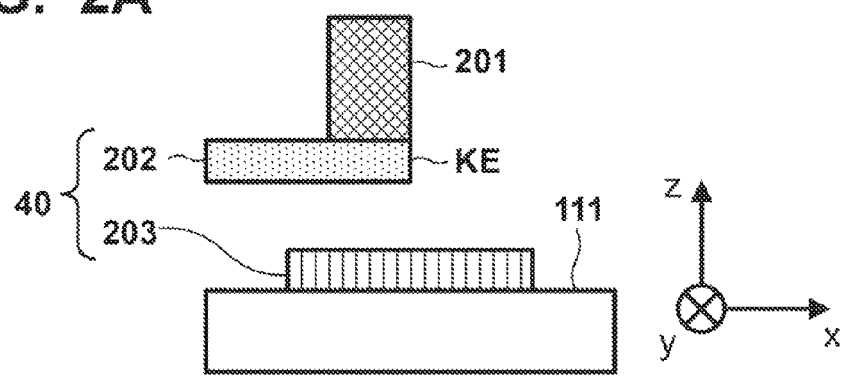
FIGS. 2A to 2C are views showing the schematic arrangement of a measurement device including knife edges.
Figure 2B:
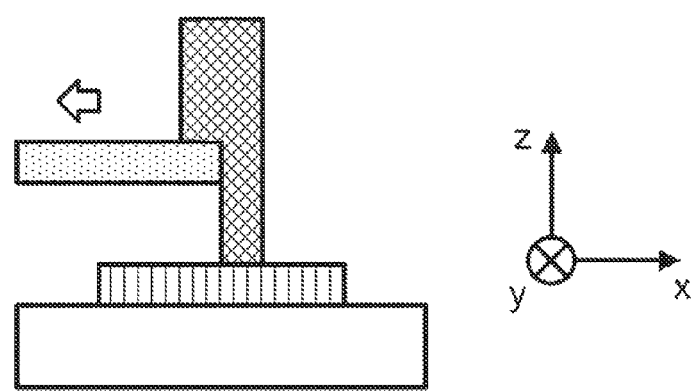
Figure 2C:
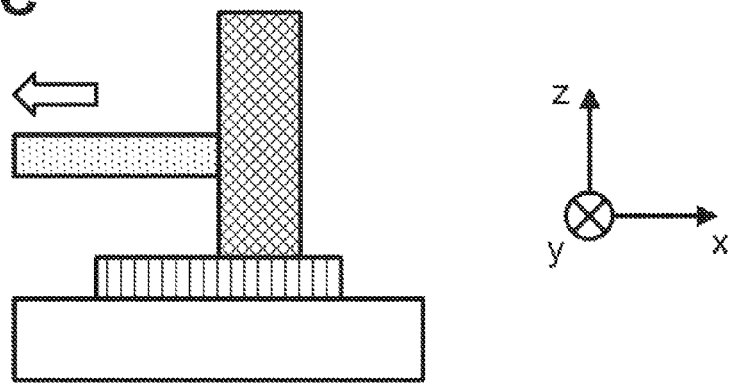

The measurement device 40 will be described with reference to FIGS. 2A to 2C. The measurement device 40 includes a knife edge plate 202 which blocks electron beams 201, and a sensor 203 which detects electron beams incident via apertures in the knife edge plate 202. The knife edge plate 202 is an electrically conductive plate, which includes a plurality of apertures each defined by an edge serving as a knife edge KE. For the sake of simplicity, FIGS. 2A to 2C show only one electron beam 201 and one knife edge KE. In a state shown in FIG. 2A, the electron beam 201 is totally blocked by the knife edge plate 202. When the electron beam 201 moves relative to a detector 112, the electron beam 201 partially irradiates the sensor 203, as shown in FIG. 2B. When the electron beam 201 further moves relative to the detector 112, the entire electron beam 201 irradiates the sensor 203, as shown in FIG. 2C.

As can be seen from FIGS. 2A to 2C, when the electron beam 201 is scanned relative to the detector 112, the amount of electron beam 201 detected by the sensor 203 (the signal output from the sensor 203) changes. Using this fact, the relative positional relationship between the electron beam 201 and the detector 112 (and, eventually, the substrate stage 111), or the intensity distribution of the electron beam 201 can be detected. As a method of scanning the electron beam 201 relative to the detector 112, a method of scanning the electron beam 201 by the deflector 108, or a method of scanning the substrate stage 111 by the substrate driving mechanism 30 is available. Alternatively, the substrate stage 111 may be scanned by the substrate driving mechanism 30 while the electron beam 201 is scanned by the deflector 108.

Figure 3A:
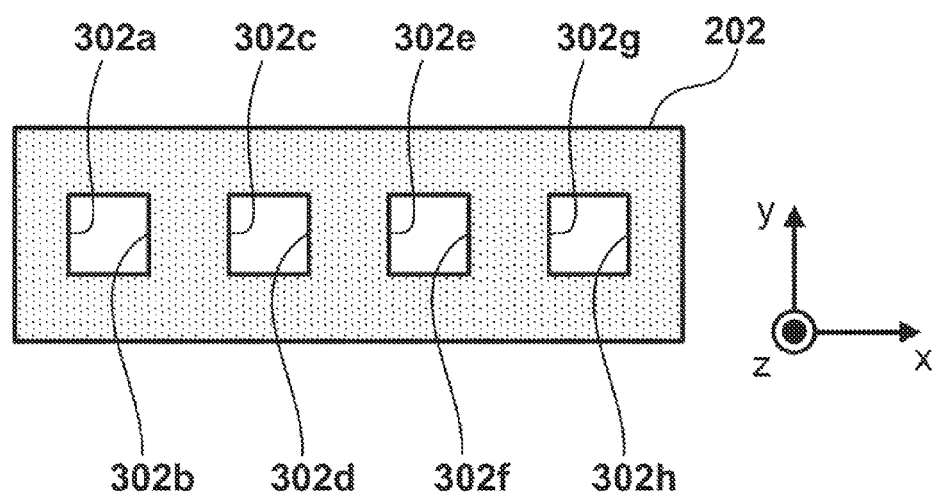
FIGS. 3A and 3B are views showing a knife edge plate including a plurality of knife edges.
Figure 3B:
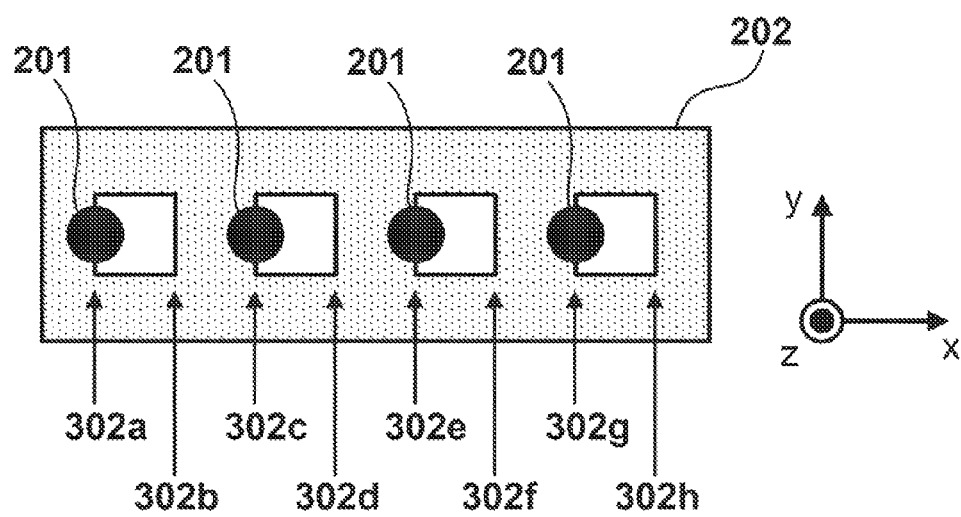

FIG. 3A schematically illustrates an example of the arrangement of the knife edge plate 202. FIG. 3B shows the electron beams 201, together with the knife edge plate 202. The knife edge plate 202 includes a plurality of knife edges. In an example shown in FIGS. 3A and 3B, the knife edge plate 202 includes four apertures, which form eight knife edges 302a to 302h. The knife edges 302a to 302h correspond to the knife edge KE shown in FIGS. 2A to 2C. The number of apertures or the number of knife edges can arbitrarily be determined.

Note that FIG. 3A shows a knife edge plate 202 in a standard state (that is, a knife edge plate 202 including knife edges 302a to 302h set at positions corresponding to a standard state). Also, FIG. 3B shows a knife edge plate 202 in a standard state, and an array of electron beams 201 in a standard state. Referring to FIG. 3B, the positions of the knife edges 302a to 302h have no error, and the array pitch of knife edges 302a, 302c, 302e, and 302g is equal to that of electron beams 201. The standard state can be construed as, for example, an ideal state or a state conforming to design values.

Figure 4:
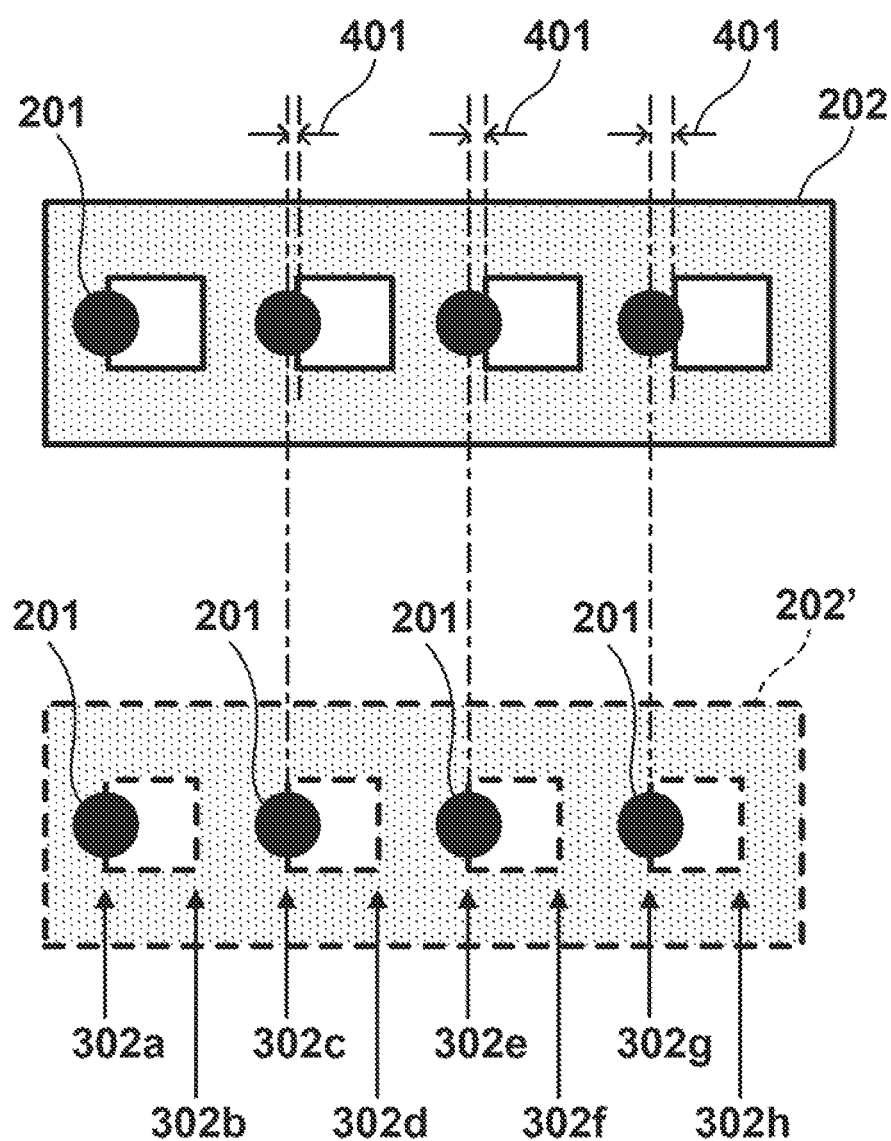
FIG. 4 is a view showing deformation of the knife edge plate (a change in position of the knife edges)

FIG. 4 shows the situation in which the positions of the electron beams 201 remain in the standard state, while the positions of the knife edges 302a to 302h have fluctuated from their standard state due to deformation (expansion) of the knife edge plate 202. Note that a knife edge plate 202' indicated by a dotted frame is illustrated in FIG. 4 for the sake of comparison, and is identical to the knife edge plate 202 in the standard state shown in FIGS. 3A and 3B. Reference numerals 401 denote the amount of shift between the knife edges 302c, 302e, and 302g and the centers of the electron beams 201, respectively. Because the array of electron beams 201 is in the standard state, the amount of shift 401 is equivalent to the amount of fluctuation in position of the knife edges 302c, 302e, and 302g from the standard state.

Figure 5:
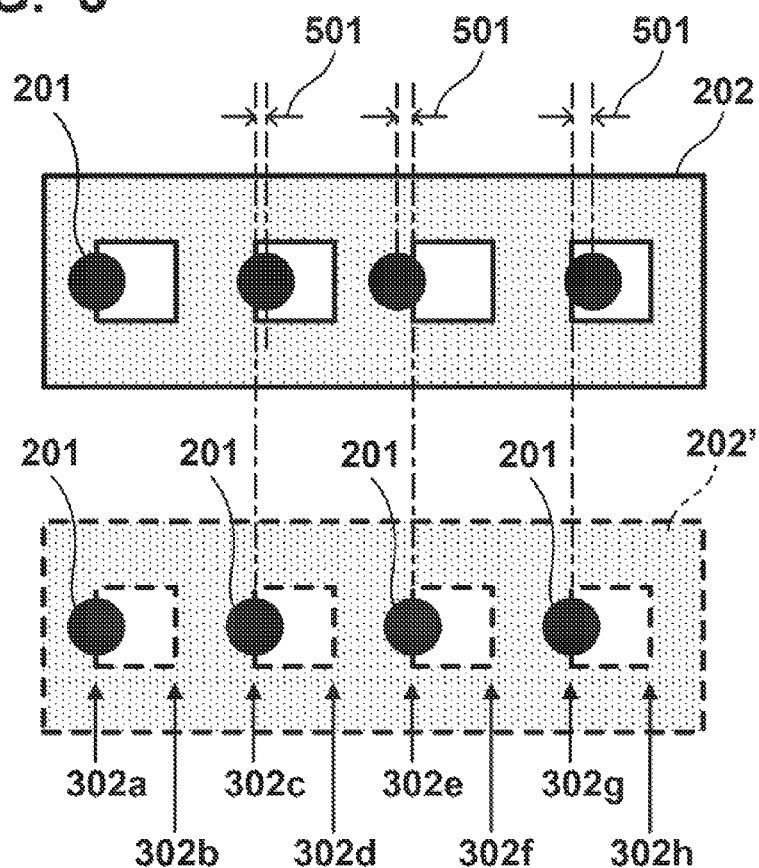
FIG. 5 is a view showing a change in irradiated position of electron beams.

FIG. 5 shows the situation in which the positions of the knife edges 302a to 302h remain in the standard state as the knife edge plate 202 has not deformed (expanded), while the positions of the electron beams 201 have fluctuated from their standard state. Note that the electron beams 201 which are shown together with a knife edge plate 202' indicated by a dotted frame are illustrated for the sake of comparison, and are identical to the electron beams 201 in the standard state shown in FIGS. 3A and 3B. Reference numerals 501 denote the amount of shift between the knife edges 302c, 302e, and 302g and the centers of the electron beams 201, respectively. Because the positions of the knife edges 302c, 302e, and 302g are in the standard state, the amount of shift 501 is equivalent to the amount of fluctuation in position of the electron beams 201 from the standard state.

Figure 6:
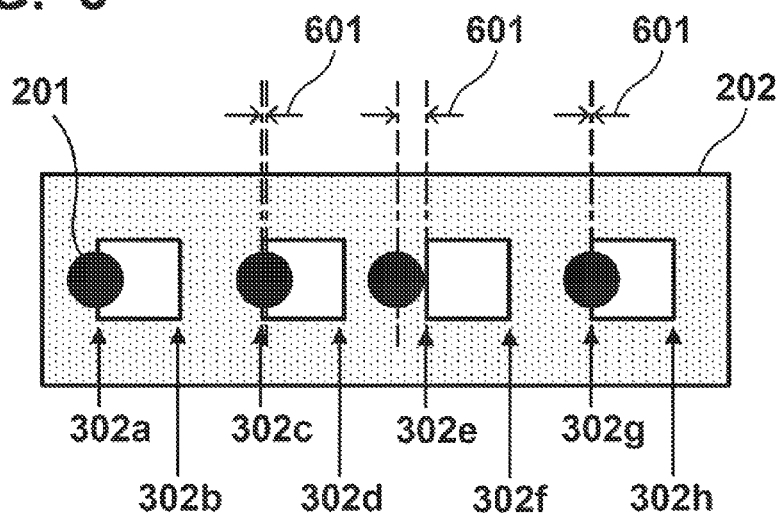
FIG. 6 is a view showing deformation of the knife edge plate and a change in irradiated position of the electron beams.

FIG. 6 shows the situation in which both the positions of the knife edges 302a to 302h and those of the electron beams 201 have shifted from their standard states. Reference numerals 601 denote the amount of shift between the knife edges 302c, 302e, and 302g and the centers of the electron beams 201, respectively. Because it is often the case that both the positions of the knife edges 302a to 302h and those of the electron beams 201 shift from their standard states, the relative positions between the knife edges 302a to 302h generally need to be determined upon measurement. Note that as long as the relative positions between the knife edges 302a to 302h can be determined, the position of one knife edge can be specified with reference to that of another knife edge.

A calibration operation for the measurement device 40 will be described below. In this calibration operation, the amount of deformation of the knife edge plate 202 or the relative positions between the knife edges 302a to 302h are obtained to determine correction information based on the obtained amount of deformation or relative positions. This correction information is used to allow the controller 50 (computing unit 116) to correct the result of measuring the characteristics of the electron beams by the measurement device 40. This correction operation can be done to remove any error due, for example, to the deformation of the knife edge plate 202 from the measurement result obtained by the measurement device 40.

Figure 7A:
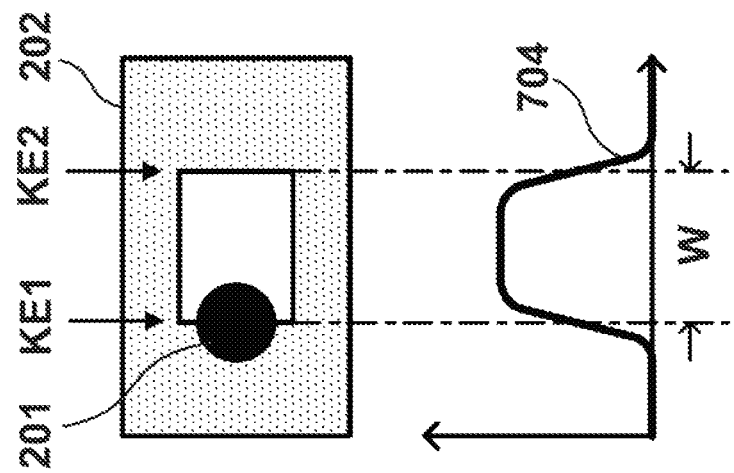
FIGS. 7A to 7C are views each showing the relationship between the amount of deformation of the knife edge plate and the signal waveform obtained by a detector.
Figure 7B:
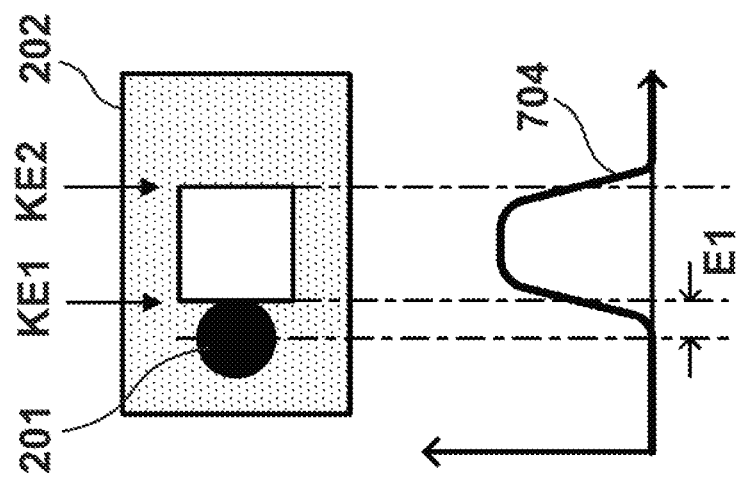
Figure 7C:
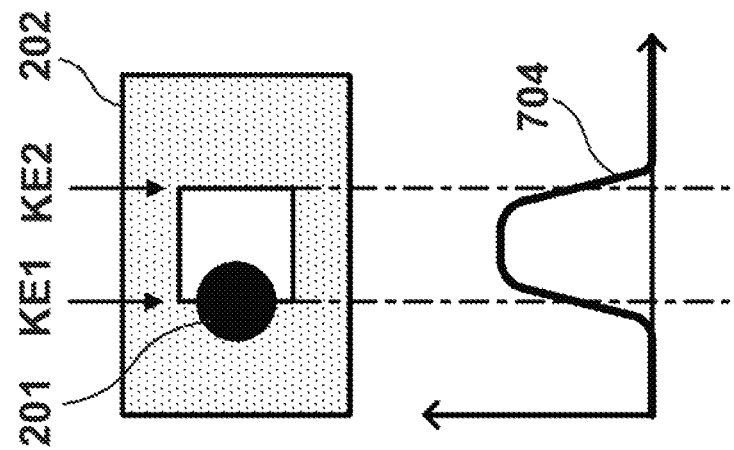

A change in position of the knife edges of the knife edge plate 202, and a change in interval between the knife edges of the knife edge plate 202 will be described with reference to FIGS. 7A to 7C. Note that for the sake of simplicity, FIGS. 7A to 7C show a knife edge plate 202 which includes one aperture, that is, two knife edges KE1 and KE2. When the electron beam 201 is scanned relative to the measurement device 40 so as to traverse the two knife edges KE1 and KE2 of the knife edge plate 202 of the measurement device 40, a waveform 704 is obtained as the waveform of the signal output from the sensor 203. Note that FIG. 7A schematically shows the case wherein neither the positions of the knife edges KE1 and KE2 nor that of the electron beam 201 has an error. FIG. 7B schematically shows the case wherein the positions of the knife edges KE1 and KE2 have an error. In an example shown in FIG. 7B, the position of the electron beam 201 is measured with an error E1 if an error of the position of the knife edge KE1 is not compensated for.

FIG. 7C shows the principle of detecting the interval between the knife edges KE1 and KE2 (the relative position between the knife edges KE1 and KE2). The interval between the knife edges KE1 and KE2 can be detected as a width W of the waveform 704 (or the edge interval in the waveform 704) upon deformation of the knife edge plate 202 (typically, expansion of the knife edge plate 202 as the knife edge plate 202 is irradiated with an electron beam). Hence, the interval between the knife edges KE1 and KE2 (the relative position between the knife edges KE1 and KE2) can be detected by detecting the width W.

An electron beam used to detect the interval between the knife edges of the knife edge plate 202 can arbitrarily be selected from a plurality of electron beams emitted by the electron beam drawing apparatus EB. The controller 50 scans an electron beam, which is used to detect the edge interval, relative to the measurement device 40 so that this electron beam traverses at least two edges among the plurality of edges. Based on the signal (waveform 704) output from the sensor 203 upon this scanning operation, the computing unit 116 determines the relative position (interval) between the above-mentioned two edges. The above-mentioned two edges may be adjacent edges or edges which sandwich at least one edge between them. It is important to scan one electron beam relative to the above-mentioned two edges. The relationship between the deflection command value for the deflector 108 and the amount of deflection of the electron beams by the deflector 108 is calibrated in advance, as described earlier. Therefore, even if the irradiated position of either electron beam has an error, the relative position (interval) between at least two knife edges detected as the amount of deflection of this electron beam is guaranteed to have high accuracy.

If one electron beam cannot be scanned relative to a plurality of knife edges to be detected, a plurality of electron beams can be used. In this case, a first electron beam is scanned relative to the measurement device 40 so as to traverse at least two knife edges among the plurality of knife edges to be detected. Based on the output from the sensor 203 upon this scanning operation, the computing unit 116 determines the relative position between the above-mentioned two knife edges. Then, a second electron beam is scanned relative to the measurement device 40 so as to traverse a first knife edge (the first knife edge is one of the above-mentioned two knife edges) and a second knife edge (the second knife edge is a knife edge other than the above-mentioned two knife edges). Based on the output from the sensor 203 upon this scanning operation, the computing unit 116 determines the relative position between the first knife edge and the second knife edge. By repeating the same process while changing the second knife edge to another knife edge, the relative positions between all the plurality of knife edges to be detected can be detected.

A calibration operation for the measurement device 40, and a process of correcting the result of measuring the characteristics of the electron beams by the measurement device 40, based on the correction information obtained by this calibration operation will be described in more detail below with reference to FIGS. 8, 9A, and 9B. An example in which the position of the fifth knife edge 302e from the left is measured with reference to the leftmost knife edge 302a will be taken as an example herein, but is not intended to limit either the reference or the knife edge to be measured. The computing unit 116 of the controller 50 performs the following operations of, for example, computing the position, interval, and distance.

Figure 8:
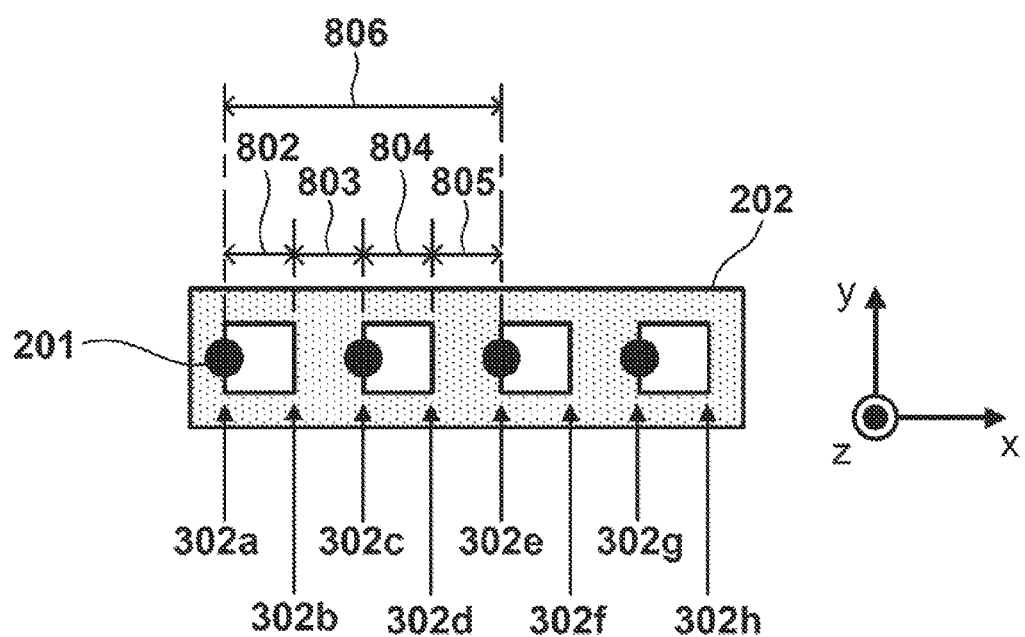
FIG. 8 is a view showing the knife edge plate in a standard state.

Referring to FIG. 8, reference numeral 802 denotes the interval between the knife edges 302a and 302b formed in one aperture in the standard state; and 804, the interval between the knife edges 302c and 302d formed in another aperture in the standard state. Reference numeral 803 denotes the interval between the knife edges 302b and 302c defining a pair of adjacent apertures in the standard state; and 805, the interval between the knife edges 302d and 302e defining another pair of adjacent apertures in the standard state. A distance 806 between the knife edges 302a and 302e (that is, the relative position between the knife edges 302a and 302e) in the standard state is the sum of the intervals 802, 803, 804, and 805.

Figure 9A:
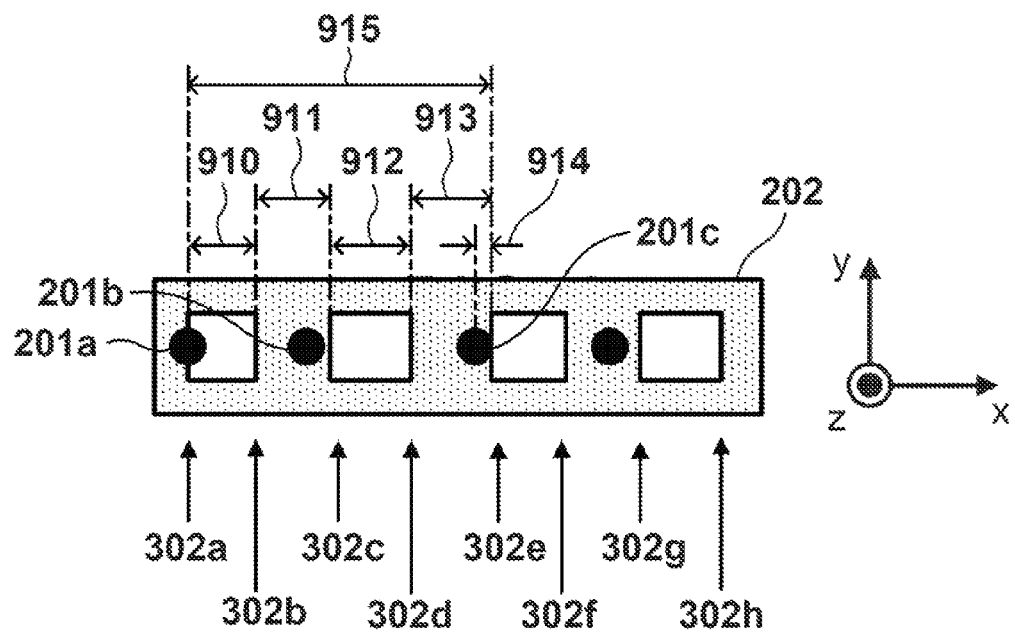
FIGS. 9A and 9B are views showing a change in irradiated position of the electron beams upon deformation of the knife edge plate.
Figure 9B:
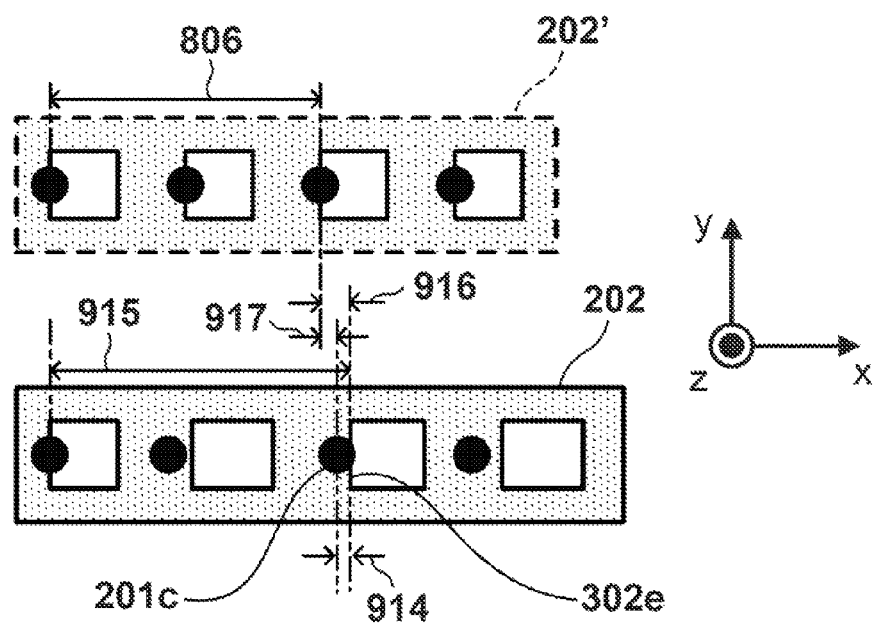

FIGS. 9A and 9B schematically show how the positions of the knife edges of the knife edge plate, and those of the electron beams have changed. Note that to avoid complications, reference numerals which denote the knife edges are not shown in FIG. 9B of FIGS. 9A and 9B. Reference numeral 910 denotes the interval between the knife edges 302a and 302b formed in one aperture; and 912, the interval between the knife edges 302c and 302d formed in another aperture. Reference numeral 911 denotes the interval between the knife edges 302b and 302c defining a pair of adjacent apertures; and 913, the interval between the knife edges 302d and 302e defining another pair of adjacent apertures.

First, the positions of the knife edges 302a, 302b, and 302c, and the intervals 910 and 911 are measured using an electron beam 201a. Next, the positions of the knife edges 302c, 302d, and 302e, and the intervals 912 and 913 are measured using an electron beam 201b. In this case, the electron beam 201a corresponds to the above-mentioned first electron beam, and the electron beam 201b corresponds to the above-mentioned second electron beam. Also, the knife edge 302c corresponds to the above-mentioned first knife edge, and the knife edges 302d and 302e correspond to the above-mentioned second knife edge. Since the position of the knife edge 302c is measured using both the electron beams 201a and 201b, the relative positions between the knife edges 302a, 302b, 302c, 302d, and 302e can be obtained. The computing unit 116 sums the intervals 910, 911, 912, and 913 to determine a distance 915 between the knife edges 302a and 302e (that is, the relative position between the knife edges 302a and 302e) when the positions of the knife edges of the knife edge plate 202 and those of the electron beams have changed.

Although the positions of three continuous knife edges are measured in this embodiment, the positions of continuous knife edges need not always be measured, and the positions of the knife edges 302a, 302d, and 302e, for example, may be measured using the electron beam 201b. In this case, the knife edge 302a corresponds to the above-mentioned first knife edge, and the knife edges 302d and 302e correspond to the above-mentioned second knife edge.

The computing unit 116 subtracts the distance 806 from the distance 915 to determine an amount of deformation 916 of the knife edge plate 202 on the knife edge 302e. The amount of deformation 916 is used as correction information for correcting a measurement error of the measurement device 40 due to a shift in position of the knife edge 302e from that in the standard state.

Although a process of determining the position of the fifth knife edge 302e to obtain correction information has typically been described in detail above, correction information is determined for all knife edges used to measure the characteristics of the electron beams. Upon this operation, a calibration operation for reducing a measurement error of the measurement device 40 due to deformation of the knife edge plate ends. The correction information determined by the calibration operation can be displayed on the display unit 117.

By obtaining the relative position (interval) between at least two knife edges among the plurality of knife edges, the amount of deformation of the knife edge plate 202 across these two knife edges can be obtained. Hence, assuming that the knife edge plate 202 deforms uniformly, the relative positions between other knife edges may be obtained based on the relative position between the above-mentioned two knife edges. Alternatively, if deformation of the knife edge plate 202 is not uniform but nonetheless has a given regularity, the relative positions between other knife edges may be obtained based on the relative position between the above-mentioned two knife edges, and this regularity.

The controller 50 then measures the characteristics of each electron beam using the detector 112. The controller 50 corrects the measurement result obtained by the detector 112 using, for example, the fifth knife edge 302e, based on the amount of deformation 916 of the fifth knife edge 302e (the position of the knife edge 302e relative to the knife edge 302a).

A process of correcting the result of measuring the characteristics of the electron beams by the measurement device 40, based on the correction information obtained by the calibration operation, will be described below with reference to FIG. 9B. Note that a knife edge plate 202' indicated by a dotted frame is illustrated in FIG. 9B for the sake of comparison, and is identical to the knife edge plate 202 in the standard state.

In this case, the position or shape (intensity distribution) of an electron beam 201c is measured using the knife edge 302e. In this measurement operation, the position of the electron beam 201c has an amount of displacement 914 with respect to the knife edge 302e displaced upon deformation, as shown in FIG. 9B. An accurate position of the electron beam 201c is obtained by subtracting the amount of displacement 914 from the amount of deformation 916 serving as correction information. Hence, the computing unit 116 subtracts the amount of displacement 914 from the amount of deformation 916 serving as correction information to obtain an accurate amount of displacement 917 of the electron beam 201c, which reflects the correction of a measurement error using the amount of deformation 916. Thus obtained amount of displacement of the electron beam can be displayed on the display unit 117. In this case, an electron beam that requires adjustment can be highlighted.

A method of adjusting the irradiated position of each electron beam will be explained as an example of a method of adjusting the characteristics of the electron beam. To adjust or reduce the amount of displacement of each electron beam, it is only necessary to adjust the phase of a signal supplied to the blanker array 105, based on the scanning speed of the substrate stage 111, and the speed of deflection of the electron beam by the deflector 108.

A method of manufacturing a device according to an embodiment of the present invention will be described next. The device can be, for example, a semiconductor device. A semiconductor device is manufactured by a preprocess of forming an integrated circuit on a wafer (semiconductor substrate), and a post-process of completing, as a product, a chip of the integrated circuit formed on the wafer by the preprocess. The preprocess can include a step of drawing on a wafer, coated with a photosensitive agent, using the above-mentioned charged particle beam apparatus, and a step of developing the wafer. The post-process can include an assembly step (dicing and bonding) and packaging step (encapsulation).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-264124, filed Dec. 1, 2011, which is hereby incorporated by reference herein in its entirety.

What is claimed is:

1. An apparatus which performs drawing on a substrate with a charged particle beam, the apparatus comprising:
   an irradiation device configured to emit the charged particle beam to irradiate the substrate with the charged particle beam;
   a measurement device configured to measure an irradiation position of the charged particle beam emitted by the irradiation device; and
   a controller configured to correct a measurement result obtained by the measurement device, based on correction information, and control the irradiation position of the charged particle beam on the substrate based on the corrected measurement result,
   wherein the measurement device includes:
   a plate including first and second knife edges, wherein at least a part of the charged particle beam incident on the measurement device is blocked by the plate, thereby the plate is deformed; and
   a sensor configured to detect another part of the charged particle beam incident on the measurement device, while the charged particle beam is scanned relative to the plate so that the charged particle beam traverses the first and second knife edges, and
   wherein the controller is configured to determine an interval between the first and second knife edges of the plate which has been deformed, based on a result detected by the sensor, and generate the correction information based on the determined interval.

2. The apparatus according to claim 1, further comprising a stage configured to hold the substrate, wherein the controller is configured to control at least one of an operation of the irradiation device and an operation of the stage such that the charged particle beam is scanned relative to the plate.

3. The apparatus according to claim 1, wherein the plate is expanded by heat which is generated when the plate blocks the part of the charged particle beam incident on the measurement device.

4. A method of manufacturing a device, the method comprising:
   performing drawing on a substrate using a charged particle beam apparatus;
   developing the substrate on which the drawing has been performed; and
   processing the developed substrate to manufacture the device,
   wherein the charged particle beam apparatus includes:
   an irradiation device configured to emit a charged particle beam to irradiate the substrate with the charged particle beam;
   a measurement device configured to measure an irradiation position of the charged particle beam emitted by the irradiation device; and
   a controller configured to correct a measurement result obtained by the measurement device, based on correction information, and control the irradiation position of the charged particle beam on the substrate based on the corrected measurement result,
   wherein the measurement device includes:
   a plate including first and second knife edges, wherein at least a part of the charged particle beam incident on the measurement device is blocked by the plate, thereby the plate is deformed; and
   a sensor configured to detect another part of the charged particle beam incident on the measurement device, while the charged particle beam is scanned relative to the plate so that the charged particle beam traverses the first and second knife edges, and
   wherein the controller is configured to determine an interval between the first and second knife edges of the plate which has been deformed, based on a result detected by the sensor, and generate the correction information based on the determined interval.

5. An apparatus for measuring an irradiation position of a charged particle beam, the apparatus comprising:
   a plate including first and second knife edges, wherein at least a part of the charged particle beam incident on the apparatus is blocked by the plate, thereby the plate is deformed; and
   a sensor configured to detect another part of the charged particle beam incident on the apparatus, while the charged particle beam is scanned relative to the plate so that the charged particle beam traverses the first and second knife edges, and
   a computing unit configured to determine an interval between the first and second knife edges of the plate which has been deformed, based on a result detected by the sensor, generate correction information based on the determined interval, and correct the measured irradiation position of the charged particle beam based on the generated correction information.

6. An apparatus which performs drawing on a substrate with first and second charged particle beams, the apparatus comprising:
   an irradiation device configured to emit the first and second charged particle beams to irradiate the substrate with the first and second charged particle beams;
   a measurement device configured to measure irradiation positions of the first and second charged particle beams emitted by the irradiation device; and
   a controller configured to correct a measurement result obtained by the measurement device, based on correction information, and control the irradiation positions of the first and second charged particle beams on the substrate based on the corrected measurement result,
   wherein the measurement device includes:
   a plate including first, second and third knife edges, wherein at least a part of the first charged particle beam and at least a part of the second charge particle beam which are incident on the measurement device are blocked by the plate, thereby the plate is deformed; and
   a sensor configured to detect another part of the first charged particle beam incident on the measurement device, while the first charged particle beam is scanned relative to the plate so that the first charged particle beam traverses the first and second knife edges, and detect another part of the second charged particle beam incident on the measurement device, while the second charged particle beam is scanned relative to the plate so that the second charged particle beam traverses the second and third knife edges, and
   wherein the controller is configured to determine an interval between the first and third knife edges of the plate which has been deformed, based on a result detected by the sensor, and generate the correction information based on the determined interval.

* * * * *